United States Patent
Hines et al.

(10) Patent No.: US 7,118,627 B2
(45) Date of Patent: Oct. 10, 2006

(54) SYNTHESIS OF COLLOIDAL PBS NANOCRYSTALS WITH SIZE TUNABLE NIR EMISSION

(76) Inventors: Margaret A. Hines, 862 W. Parkwood Dr., Clifton Park, NY (US) 12065; Gregory D. Scholes, 705 King St. W., Apt. 605, Toronto, Ontario (CA) M5V 2W8

( * ) Notice: Subject to any disclaimer, the term of this patent is extended or adjusted under 35 U.S.C. 154(b) by 389 days.

(21) Appl. No.: 10/727,821

(22) Filed: Dec. 4, 2003

(65) Prior Publication Data
US 2005/0120946 A1    Jun. 9, 2005

(51) Int. Cl.
*C30B 7/00*    (2006.01)
(52) U.S. Cl. ............................ 117/68; 117/75
(58) Field of Classification Search .................. 117/68, 117/75; 977/DIG. 1
See application file for complete search history.

(56) References Cited

U.S. PATENT DOCUMENTS 6,251,303 B1 *   6/2001   Bawendi et al. ...... 252/301.4 R
6,815,064 B1 *   11/2004  Treadway et al. .......... 428/403

\* cited by examiner

*Primary Examiner*—Felisa Hiteshew
(74) *Attorney, Agent, or Firm*—Gifford, Krass, Groh, Sprinkle, Anderson & Citkowski, PC

(57) ABSTRACT

The present invention discloses a method for synthesis of narrowly dipsersed colloidal PbS nanocrystals that offer size-tunable near-infrared emission. The stability and processibility of these near-infrared emitting quantum dots makes them ideal materials for device applications. The use of cost-effective and non-pyrophoric precursors as well as the success of larger scale reactions means the present invention provides a method for the industrial scale production of PbS nanocrystals.

15 Claims, 3 Drawing Sheets

Absorption (left) and PL (right) spectra of PbS nanocrystals ~ 6.5 nm in diameter.

Absorption (left) and PL (right) spectra of PbS nanocrystals ~ 6.5 nm in diameter.

HRTEM images of PbS nanocrystals. The materials are highly crystalline as indicated by the close-up image of a single particle on the right. The spacings on the rings of the SADP correspond to the crystal structure of bulk PbS.

SYNTHESIS OF COLLOIDAL PBS NANOCRYSTALS WITH SIZE TUNABLE NIR EMISSION

FIELD OF THE INVENTION

This invention relates to a synthesis of colloidal lead sulphate (PbS) nanocrystals with size tunable nir emission.

BACKGROUND OF THE INVENTION

Over the past decade tremendous efforts have been made optimizing the synthesis of semiconductor nanocrystal colloids. These 'quantum dot' materials, exhibiting 3D quantum confinement, are highly desired for their size-tunable optical properties. Synthetic routes utilizing organometallic precursors enables production of nanocrystalline particles with nearly monodisperse size dispersions as disclosed in (1). The resulting narrow emission bandwidths and luminescence efficiencies that are achieved through these controlled syntheses as disclosed in (2, 3, 4, 5) are required for applications such as optoelectronic devices (6–10) and biological fluorescence labeling (11–13). The explosive growth of the telecommunications industry has fueled the pursuit of luminescent quantum dots that emit at key NIR wavelengths of 1.3 and 1.55 μm. The vast majority of colloidal quantum dot research has focused on II–VI and III–V materials and includes substantial efforts in the development and exploration of InAs nanocrystalline materials (14, 15). Despite having a bulk band gap of 0.36 eV thus spanning the desired NIR energy region, InAs is a less than desirable material with which to work. Arsenic is highly toxic, and the synthetic routes to prepare the reaction precursors are extremely dangerous. Alternatively, semiconductors of group IV–VI materials, notably PbS with a bulk band gap of 0.41 eV, offers comparable size tunability and can be produced with inexpensive and effectively safer synthetic precursors.

Lead chalcogenide quantum dots are highly desirable as well for the strong-confinement limit offered by these small-band gap materials. Given that most II–VI and III–V semiconductor materials have large hole masses, strong quantum confinement is difficult to achieve with them. For example, as discussed by Wise (16). InSb has an exciton Bohr radius of 54 nm but the Bohr radius of the hole is only 2 nm, thus preventing strong confinement of the hole. In comparison, the electron and hole Bohr radii of the lead chalcogenides are an order of magnitude larger and imply large confinement energies. In the limit of strong confinement the third-order nonlinear optical response of PbS nanocrystals is expected to be huge, 30 times that of GaAs and 1000 times that of CdSe materials, thus rendering PbS highly desirable for photonic and optical switching device applications.

The pursuit of synthetic routes for the production of lead chalcogenide quantum dots is not a recent endeavor. These methods include solution phase, (17, 18) gas phase, (19) and solid-statei syntheses (20) as well as polymer films, (21) and glass host fabrication (22–24). The limitation of solution phase and gas phase syntheses is the inability to achieve tunable particle sizes. Conversely, the preparation of PbS and PbSe QDs in glass matrices has been extremely successful. These size tunable materials are narrowly dispersed, as evidenced by the well-resolved features in the absorption spectra.

A major drawback shared by all of the aforementioned methods is the inability to readily isolate the materials thus preventing incorporation into alternative media for post-synthetic applications such as device fabrication. This limitation is lifted when working with colloidal quantum dots prepared by the solution phase synthesis utilizing organometallic percursors such as that developed for the production of II–VI materials (2).

SUMMARY OF THE INVENTION

The present invention provides a method for synthesizing colloidal nanocrystals of periodic table groups IV–VI compounds with size-tunable near infrared emission, comprising the steps of;
 a) forming a first solution by dissolving a compound containing a metal selected from group IV of the periodic table in an effective solvent;
 b) forming a second solution by dissolving a compound containing an element selected from group VI of the periodic table in an effective solvent and mixing said second solution with said first solution to form a third solution;
 c) stirring the third solution for a selected period of time under controlled heating to grow colloidal nanoparticles of a IV–VI compound of selected mean size, said effective solvent including ligands that stabilize said colloidal nanoparticles; and
 d) isolating the colloidal nanoparticles of selected mean size.

In another aspect of the invention there is provided a method for synthesizing colloidal nanocrystals of PbS, comprising the steps of;
 a) forming a first solution by dissolving a compound containing lead (Pb) in an effective stabilizing solvent;
 b) forming a second solution by dissolving a compound containing sulphur (S) in an effective solvent and mixing said second solution with said first solution to form a third solution;
 c) stirring the third solution for a selected period of time under controlled heating to grow colloidal nanoparticles of PbS of selected mean size, said effective solvent including ligands that stabilize said PbS colloidal nanoparticles; and
 d) isolating the colloidal PbS nanoparticles of selected mean size.

BRIEF DESCRIPTION OF THE DRAWINGS

The present invention will now be described by way of example only, reference being had to the accompanying drawings in which.

DETAILED DESCRIPTION OF THE INVENTION

Figure 1:
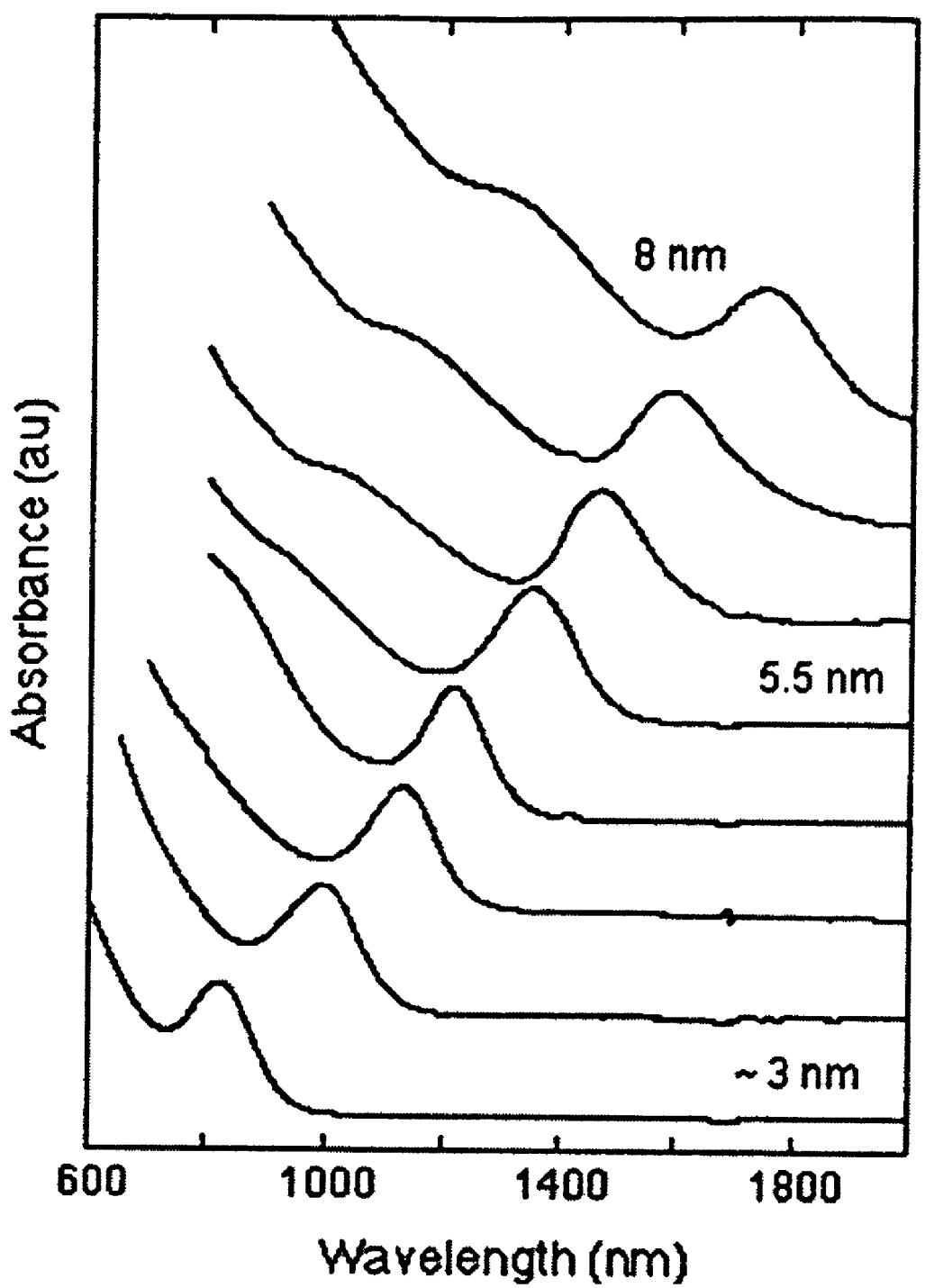
FIG. 1 shows the absorption Spectrum of size-tunable PbS nanocrystals produced in accordance with the present invention.

There is disclosed herein the synthesis of luminescent size-tunable PbS colloidal quantum dots. PbS is less hazardous than PbSe due to the lower toxicity of sulfur versus selenium. Furthermore, S is advantageous over Se for its decreased oxidation potential, thereby rendering the surfaces of PbS nanocrystals more air-stable than those of PbSe. Accordingly, the ligand solvent most readily utilized for the chalcogenide species, trioctylphosphine, coordinates more strongly to S than to Se and is contemplated by the inventors to provide better surface passivation for PbS nanocrystals.

The method of the present invention will now be illustrated with the following non-limiting example.

EXAMPLE

In a non-limiting explemplary synthesis, PbO is dissolved in oleic acid in the range of 0.05 to 0.2 M under an inert atmosphere with stirring at 130–150° C. for approximately one hour. A solution of bis(trimethylsilyl)sulfide in trioctylphosphine, with the amount of S corresponding to a Pb:S ratio of 2:1, is rapidly injected into vigorously stirring Pb-oleate/oleic acid solution at 30–150° C. The lower injection temperatures result in smaller initial particle size. The nanocrystals uniformly grow in particle-size with continued heating, the rate being dependent upon the temperature. Fractions of the reaction are removed during this growth process to provide materials in a range of particle sizes.

The nanocrystals can be precipitated with polar solvents and re-dispersed in a variety of organic solvents. More particularly, the nanocrystals are precipitated out of the reaction by the addition of a polar solvent, such as methanol, acetonitrile, or ethyl acetate. The precipitate is collected by centrifugation and re-dispersed by adding a suitable organic solvent, such as toluene, chloroform, hexanes, etc. Any by product residue is then removed by centrifuging the nanocrystal solution. The nanocrystals are precipitated and re-dispersed in this same manner a second time to further remove the leftover oleic acid and trioctylphosphine. The end result is a freely flowing powder that can be dissolved in a wide variety of organic solvents, which can be then incorporated into other more suitable media. As well, the surface ligands can be exchanged to enhance or alter solubility properties, including promoting solubility into aqueous media.

The PbS synthesis is based on adaptations of those for cadmium chalcogenides (2, 25, 26) and lead selenide (27). Early attempts by the inventors using similar reaction conditions indicated that lead and sulfur readily react to form bulk-like particles. Thus, the inventors have discovered that a key to the successful quantum dot synthesis is to slow down the reaction thereby controlling the growth. The stabilizing ligands typically perform this crucial role. Recently Yu and Peng reported the effects of varying the oleic acid ligand concentration in the synthesis of II-VI materials (28). Accordingly, the inventors have observed an effect on the initial particle size and rate of growth corresponding to the amount of oleic acid present in the reaction. Unlike the CdS they report, PbS is successfully grown in pure oleic acid.

Figure 2:
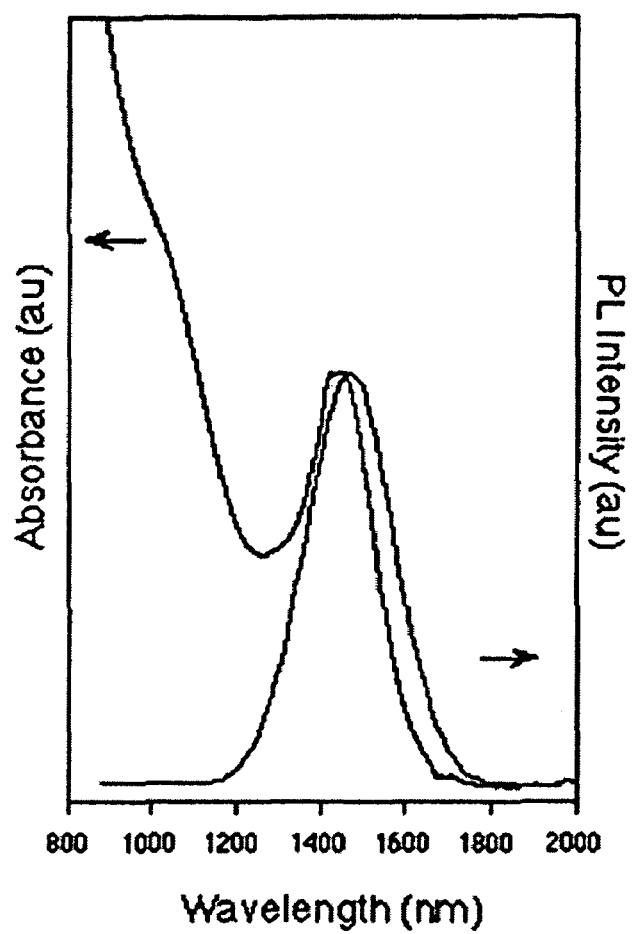
FIG. 2 shows absorption (left) and photoluminescence (right) spectra of PbS nanocrystals ~6.5 nm in diameter.

The nanocrystal particle size is tunable by means of temperature controlled growth. The absorption and photoluminescence spectra displayed in FIG. 1 (dilute solutions in toluene) indicate the range of sizes one can generate in a single reaction by removing portions of the reaction. The well-defined peaks in the absorption spectra correspond to the lowest energy exciton transition and are a measure of the narrow size dispersion achieved with the synthesis. The shape of the intense photoluminescence (PL) peak in the spectrum shown in FIG. 2 indicates the emission is purely band-edge and lacks a broad tail at lower energies from trapped-state emission.

Transmission electron microscopy (TEM) images taken on a FEI Technai 20 instrument equipped with a Gatan camera provided sizing data and particle size distributions. The nanocrystals were imaged as well under HRTEM to determine the crystalline quality of the particles. Energy-dispersive X-ray fluorescence performed in scanning transmission electron microscopy (STEM) mode confirmed the presence of Pb and S in the nanocrystal samples. As indicated in the TEM image of the array of PbS nanocrystals pictured in FIG. 2a, the shape of the particles is predominantly spherical-like, but a strong tendency to be polyhedral is indicated by sharp edges and facets on the crystallites in some TEM images. Correlating particle shape with reaction conditions reveals that annealing occurs to produce more spherical, less faceted, structures in crystallites that have experienced prolonged heating at elevated temperatures compared with fractions removed shortly after nucleation.

Figures 3A, 3B:
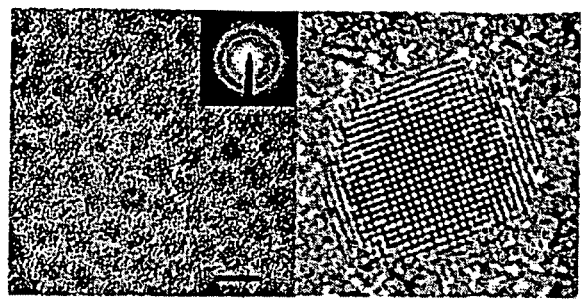
FIGS. 3a, 3b are HRTEM images of PbS nanocrystals showing the materials are highly crystalline as indicated by the close-up image of a single particle on the righ, the spacings on the rings of the SADP correspond to the crystal structure of bulk PbS.

The cubic rock salt crystal structure of the particles was confirmed by TEM and powder XRD. The HRTEM image in FIG. 3a shows a particle oriented along the [001] direction. The high degree of crystallinity is clearly indicated by the imaged single domain and lacks any defects or stacking faults. The inset in FIG. 3b, the selected area diffraction pattern, confirms cubic symmetry of the PbS materials.

The combined results from ICP/AES and combustion elemental analysis support the expected stoichiometric ratio of 1:1 Pb:S. The results also indicate the surface is predominantly covered by oleate ligands with levels of trioctylphosphine too low to quantify. The percent coverage of the ligands was estimated from the elemental analysis results in conjunction with computer modeling of the nanocrystal structure, which determines the number of surface Pb and S atoms relative to the total number of atoms for any given nanocrystal size. This information in combination with absorption data has been used to calculate molar extinction coefficients for PbS in the available range of nanocrystal sizes. Preliminary results indicate that the extinction coefficients for PbS are ~105.

The capping ligands on the PbS nanocrystals can be exchanged for shorter alkyl amines. This is useful for optimizing injection of electrons and holes into the nanocrystals by decreasing the chain length of the ligands. The nanocrystal powder is dispersed in a suitable amount of amine, such as octylamine, and stirred for several hours. The nanocrystals are precipitated with dimethylformamide, and the resulting nanocrystal powder can then be dispersed into the desired organic solvent. After performing the ligand exchange the band-edge exciton peak is blue-shifted indicating a decrease in the size of the nanocrystal, most likely due to removal of surface Pb and S atoms that are evidently strongly coordinated to the ligand species.

While the method in the non-limiting Example above used Bis(trimethylsilyl)sulfide as the sulfur precursor, it will be understood that many other sulfur precursors may be used, including but not limited to bis(trialkylsilyl)sulfide, elemental sulfur, dialkyl thioureas, thioacetamide, dimethylthioformamide, alkylthiols, alkyldisulfides and hydrogen sulfide.

Similarly, while the dilution solvent for injection of the sulfur precursor used in the example above was trioctylphosphine, in general a hydrocarbon solvent may be used bearing in mind there are boiling point limitations imposed on the solvents used by the temperature desired for nucleation. Other solvents which may be used include trialkyl phosphine, n-alkyl amine, trialkyl amine, octadecene and oleic acid to mention just a few.

In addition to lead oxide (PbO) as the metal precursor, other metal precursors may include, but are not limited to lead acetate, lead acetylacetonate, lead nitrate, lead chloride, lead iodide, lead bromide, lead sulfate, lead tantalite, lead titanate and lead chromate.

In addition to producing nanocrystals of PbS, the inventors contemplate the present method may be applied to other group IV materials such as but not limited to tin (Sn) and germanium (Ge). In the case of Sn the metal precursor may be selected from the group including but not limited to tin acetate, tin bromide, tin chloride, tin 2-ethylhexanoate, tin fluoride, tin iodide, tin oxalate, tin oxide, tin phthalocyanine and tin sulfate to mention just a few. For germanium the metal precursor may be germanium iodide.

While oleic acid is the preferred coordinating solvent for dissolving the metal precursor (PbO), it will be understood that more broadly the coordinating solvent for the metal precursor are selected to serve as a surfactant ligand on the colloid and are preferably fatty acids, loosely defined as R—COOH, with the following examples of R, R=$CH_3$ $(CH_2)_n$; R=$CH_3(CH_2)_xCH$=$CH(CH_2)_y$; R=$CH_3(CH_2)_x$ C≡C $(CH_2)_y$; which for all x+y=n and n>5; R=$(PhC≡C)_m$, m≧1.

The choices for the dilution solvent for the metal precursor/ligand mixture include non-coordinating hydrocarbon compounds, loosely defined as R—CH3; R—O—R'; where R and R' are hydrocarbon substituents containing saturated chains, unstaturated chains, or aromatic groups.

In summary, the present invention discloses a synthetic route for the production of narrowly dipsersed colloidal PbS nanocrystals that offer size-tunable near-infrared emission. The stability and processibility of these near-infrared emitting quantum dots makes them ideal materials for device applications. The use of cost-effective and non-pyrophoric precursors as well as the success of larger scale reactions means the present invention provides a method for the industrial scale production of PbS nanocrystals.

The invention involves use of a metal reagent capable of providing metal ion in the +2 oxidative state either upon dissolution into the reaction solvent, coordination to the reaction solvent, or after undergoing oxidation or reduction. The use of a fatty acid for coordination to the metal atom serves as a stabilizing ligand that aids in controlling particle growth and imparts colloidal properties to the final nanocrystal product. The term fatty acid is used to loosely describe compounds with a carboxylic acid substituent group, —COOH. The main chain of the fatty acid is preferably a hydrocarbon chain of length greater than 6 carbon atoms less than 30, which can be saturated, unsaturated, oligomeric, or aromatic in nature. The reagent providing a sulfur atom in the reaction can be any of those listed previously. The sulfur reagent is dispersed or dissolved in one of the dilution solvents listed above.

The metal reagent is added to the fatty acid with or without addition of a dilution solvent (described above as dilution solvent for metal precursor/ligand mixture), the mixture heated under inert atmosphere to a temperature sufficient to coordinate metal ion in +2 oxidative state to the carboxylate group, typically between 30–300° C. The process to synthesize the nanocrystalline materials includes the following variations:

i. The metal salt/fatty acid mixture w/w/o dilution solvent is heated to that desired for the injection of the sulfur reagent and subsequent nucleation of nanocrystals, typically 30–350° C., depending upon desired initial particle size. The sulfur reagent dispersed in a suitable solvent, as described in claim 3, is injected into the metal salt/fatty acid mixture.

ii. The metal salt/fatty acid mixture along with the sulfur reagent of claim 3 are simultaneously injected into the reaction flask containing a dilution solvent.

The nanocrystal colloids are isolated by addition of a polar solvent, such as small alkyl chain alcohols, ethyl acetate, dimethylformamide, acetonitrile, that induces reversible aggregation of the particles and can then be separated from the supernatant solution and solvents.

The resulting nanocrystal colloids are subsequently soluble in a variety of organic solvents, such as toluene, cyclohexane, chloroform, carbon tetrachloride, dichloromethane, hexane, octane.

The resulting nanocrystal colloidal particles can be dissolved into alternative coordinating solvents that drive exchange of the surfactant ligands. The exchange provides tunability of the solubility.

As used herein, the terms "comprises", "comprising", "including" and "includes" are to be construed as being inclusive and open ended, and not exclusive. Specifically, when used in this specification including claims, the terms "comprises" and "comprising" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

REFERENCES

1. Murray, C. B.; Kagan, C. R.; Bawendi, M. G. *Annu. Rev. Mater. Sci.* 2000, 30, 545.
2. Murray, C. B.;. Norris, D. J.; Bawendi, M. G. *J. Am. Chem. Soc.* 1993, 115,: 8706.
3. Hines, M. A.; Guyot-Sionnest, P. *J. Phys. Chem.* 1996, 100, 468.
4. Dabbousi, B. O.; Rodriquez-Viejo, J.; Mikulec, F. V.; Heine, J. R.; Mattoussi, H.; Ober, R.; Jensen, K. F.; Bawendi, M. G. *J. Phys. Chem. B* 1997, 101, 9463.
5. Cao, Y. W.; Banin, U. *J. Am. Chem. Soc.* 2000, 122, 9692.
6. Colvin, V. L.; Schlamp, M. C.; Alivisatos, A. P. *Nature* 1994, 370, 354.
7. Dabboussi, B. O.; Bawendi, M. G.; Onitsuka, O.; and Rubner, M. F. *Appl. Phys. Lett.* 1995, 66, 1316.
8. Schlamp, M. C.; Peng, X. G.; Alivisatos, A. P. *J. Appl. Phys.* 1997, 82, 5837.
9. Mattoussi, H.; Radzilowski, L. H.; Dabboussi, B. O.; Thomas, E. L.; Bawendi, M. G.; Rubner, M. F. *J. Appl. Phys.* 1998, 83, 7965.
10. Tessler, N.; Medvedev V.; Kazes, M.; Kan, S.; Banin, U. *Science,* 2002, 295, 1506.
11. Bruchez, M.; Moronne, M.; Gin, P.; Weiss, S.; Alivisatos, A. P. *Science,* 1998, 281, 2013.
12. Chan, W. C. W.; Nie, S. *Science,* 1998, 281, 2016.
13. Mitchell, G. P.; Mirkin, C. A.; Letsinger, R. L. *J. Am. Chem. Soc.* 1999, 121, 8122.
14. Guzelian, A. A.; Banin, U.; Kadavanich, A. V.; Peng, X.; Alivisatos, A. P. *Appl. Phys. Lett.* 1996, 69, 1462.
15. Peng, X.; Wickham, J.; Alivisatos, A. P. *J. Am. Chem. Soc.* 1998, 120, 5343.
16. Wise, F. W. *Acc. Chem. Res.* 2000, 33, 773.
17. Nenadovice, M. T.; Comor, M. I.; Vasic, V.; Micic, O. I. *J. Phys. Chem.* 1990, 94, 6390.

18. Trindade, T.; O'Brien, P. O.; Zhang, X.; Motevalli, M. *J. Mater. Chem.* 1997, 7,1011.
19. Kaito, C.; Saito, Y.; Fujita, K. *Jpn. J. Appl. Phys.* 1987, 26, 1973.
20. Wang, W.; Liu, Y.; Zhan, Y.; Zheng, C.; Wang, G. *Mater. Res. Bull.* 2001, 36, 1977.
21. Wang, S. H.; Yang, S. H. *Langmuir* 200, 16,389.
22. Borrelli, N. F.; Smith, D. W. *J. Non-Cryst Sol.* 1994, 180, 25.
23. Lipovskii, A.; Kolobkova, E.; Petrikov, V.; Kang, I.; Olkhovets, A.; Krauss, T.; Thomas, M.; Silcox, J.; Wise, F.; Shen, Q.; Kycia, S. *Appl. Phys. Lett.* 1997, 71, 3406.
24. Lipovskii, A. A.; Kolobkova, E. V.; Olkhovets, A.; Petrikov, V. D.; Wise, F. *Physica E,* 2000, 5,157.
25. Peng, Z. A.; Peng, X. *J. Am. Chem. Soc.* 2001, 123, 183.
26. Qu, L.; Peng, Z. A.; Peng, X. *Nano Lett.* 2001, 1, 333.
27. Murray, C. B.; Sun, S.; Gaschler, W.; Doyle, H.; Betley, T. A.; Kagan, C. R. *IBM J. Res. & Dev.* 2001, 45, 47.
28. Yu, W. W.; Peng, X. Angew. *Chem. Int. Ed.* 2002, 41, 2368.

What is claimed is:

1. A method for synthesizing colloidal nanocrystals of periodic table groups IV–VI compounds with a size-tunable electromagnetic emission, comprising the steps of:
   a) forming a first solution by dissolving a compound containing a metal selected from group IV of the periodic table in a first effective solvent;
   b) forming a second solution by dissolving a compound containing an element selected from group VI of the periodic table in a second effective solvent and mixing said second solution with said first solution to form a third solution;
   c) agitating the third solution for a selected period of time under controlled heating to grow colloidal nanoparticles of a IV–VI compound of selected mean size, said effective solvent including ligands that stabilize said colloidal nanoparticles; and
   d) isolating the colloidal nanoparticles of selected mean size.

2. The method according to claim 1 wherein said compound containing a metal selected from group IV of the periodic table contains lead (Pb).

3. The method according to claim 2 wherein said compound containing a metal selected from group IV of the periodic table is selected from the group consisting of lead acetate, lead acetylacetonate, lead nitrate, lead chloride, lead iodide, lead bromide, lead sulfate, lead tantalite, lend titanate and lead chromate.

4. The method according to claim 1 wherein said compound containing an element selected from group VI of the periodic table contains sulphur.

5. The method according to claim 4 wherein said compound containing a sulphur is selected from the group consisting of bis(trimethylsilyl)sulfide, bis(trialkylsilyl)sulfide, elemental sulfur, dialkyl thioureas, thioacctamide, dimethylthioformamide, alkylthiols, alkyldisulfides and hydrogen sulfide, and wherein said second effective solvent is selected from the group consisting of trialkyl phosphine, n-alkyl amine, trialkyl amine, octadecene and oleic acid.

6. The method according to claim 1 wherein suid compound containing a metal selected from group IV of the periodic table contains a metal selected from the group consisting of lead (Pb), tin (Sn) and germanium (Ge).

7. The method according to claim 1 wherein said effective solvent including ligands that stabilize said colloidal nanoparticles includes a fatty acid.

8. The method according to claim 1 wherein said step of isolating the colloidal nanoparticles of selected mean size includes addition of a polar solvent to said third solution, said polar solvent being selected from the group consisting of small alkyl chain alcohols, ethyl acetate, dimethylformamide, acetonitrile, that includes reversible aggregation of the colloidal nanoparticles and can then be separated from the supernatant solution and solvents.

9. The method according to claim 1 wherein said step of agitating the third solution for a selected period of time under controlled heating to grow colloidal nanoparticles is for long enough to grow colloidal particles in a range from about 1 nm mean diameter to about 10 nm mean diameter.

10. The method according to claim 1 wherein said effective temperature is in a range from about 30° C. to about 350° C.

11. The method according to claim 1 wherein said second effective solvent is selected from the group consisting of trialkyl phosphine, n-alkyl amine, trialkyl amine, octadecene and oleic acid.

12. A method for synthesizing colloidal nanocrystals of PbS, comprising the steps of:
   a) forming a first solution by dissolving a compound containing lead (Pb) in an effective stabilizing solvent;
   b) forming a second solution by dissolving a compound containing sulphur (S) in an effective solvent and mixing said second solution with said first solution to form a third solution;
   c) stirring the third solution for a selected period of time under controlled heating to grow colloidal nanoparticles of PbS of selected mean size, said effective solvent including ligands that stabilize said PbS colloidal nanoparticles; and
   d) isolating the colloidal PbS nanoparticles or selected mean size.

13. The method according to claim 12 wherein said compound containing lead is PbO, and wherein said effective stabilizing solvent is oleic acid.

14. The method according to claim 12 wherein said step of forming a second solution by dissolving a compound containing sulphur (S) in an effective solvent effective solvent includes dissolving bis(trimethylsilyl)sulfide in trioctylphosphine.

15. The method according to claim 12 wherein said compound containing lead (Pb) is selected from the group consisting of lead acetate, lead acetylacetonate, lend nitrate, lead chloride, lead iodide, lead bromide, lead sulfate, lead tantalite, lead titanate and lead chromate.

* * * * *